(12) United States Patent
Hartramph et al.

(10) Patent No.: US 10,833,572 B2
(45) Date of Patent: Nov. 10, 2020

(54) ELECTRIC LINEAR MOTOR AND TESTING DEVICE

(71) Applicant: Festo SE & Co. KG, Esslingen (DE)

(72) Inventors: Ralf Hartramph, Albershausen (DE); Martin Rapp, Kernen i.R. (DE); Andreas Braig, Stuttgart (DE)

(73) Assignee: FESTO SE & CO. KG, Esslingen (DE)

( * ) Notice: Subject to any disclaimer, the term of this patent is extended or adjusted under 35 U.S.C. 154(b) by 206 days.

(21) Appl. No.: 15/766,462

(22) PCT Filed: Oct. 14, 2016

(86) PCT No.: PCT/EP2016/074648
§ 371 (c)(1),
(2) Date: Apr. 6, 2018

(87) PCT Pub. No.: WO2017/064223
PCT Pub. Date: Apr. 20, 2017

(65) Prior Publication Data
US 2018/0301970 A1 Oct. 18, 2018

(30) Foreign Application Priority Data
Oct. 14, 2015 (DE) .................. 10 2015 219 957

(51) Int. Cl.
*H02K 41/035* (2006.01)
*G01R 31/34* (2020.01)
(Continued)

(52) U.S. Cl.
CPC ......... *H02K 41/0356* (2013.01); *G01R 31/34* (2013.01); *H01R 13/629* (2013.01); *H02K 11/215* (2016.01); *H02K 41/031* (2013.01)

(58) Field of Classification Search
CPC ... H02K 41/0356; G01R 31/34; H01R 13/629
See application file for complete search history.

(56) References Cited

U.S. PATENT DOCUMENTS

2009/0026847 A1 1/2009 Kim et al.
2011/0298308 A1 12/2011 Aoyama et al.

FOREIGN PATENT DOCUMENTS

DE 19854142 3/2000
DE 102006005800 8/2007
(Continued)

*Primary Examiner* — Minh Q Phan
(74) *Attorney, Agent, or Firm* — Hoffmann & Baron, LLP (57) ABSTRACT

An electric linear motor having a motor housing which is penetrated by an armature recess, in which a first magnet arrangement is accommodated in a stationary manner and in which an armature which has a second magnet arrangement is accommodated to be linearly movable along a movement path, wherein at least one of the magnet arrangements includes comprises a magnetic flux guide configured as a profile body and having at least one cross-sectional taper which is configured for a local increase of a flux resistance for a magnetic flux in the magnetic flux guide which is oriented along a movement path, wherein the cross-sectional taper has in the transverse direction to the movement path an extension which is less than an extension of the profile body the transverse direction to the movement path.

19 Claims, 3 Drawing Sheets

(51) Int. Cl.
*H02K 41/03* (2006.01)
*H02K 11/215* (2016.01)
*H01R 13/629* (2006.01)

(56) References Cited

FOREIGN PATENT DOCUMENTS

| | | | | |
|---|---|---|---|---|
| EP | 0905869 | 11/2010 | | |
| EP | 2549633 | 1/2013 | | |
| JP | H06335230 | 12/1994 | | |
| JP | 2007089382 | 4/2007 | | |
| JP | 2008193760 | 8/2008 | | |
| WO | WO-2007089240 A1 * | 8/2007 | ......... | H02K 41/0356 |

* cited by examiner

ELECTRIC LINEAR MOTOR AND TESTING DEVICE

This application claims priority based on an International Application filed under the Patent Cooperation Treaty, PCT/EP2016/074648, filed Oct. 14, 2016, which claims priority to DE101025219957.6, filed Oct. 14, 2015.

BACKGROUND OF THE INVENTION

The invention relates to an electric linear motor and to a testing device for testing an electronic device.

EP 0905869 B1 discloses a linear motor having a plurality of stator elements, each of which has a yoke with at least one planar surface and a plurality of windings which are disposed in a uniformly spaced-apart arrangement which extends along a predetermined direction, and having a movable element with a magnet device which has at least one magnet and no yoke, wherein the stator elements are arranged opposite one another with their planar surfaces, wherein the magnet device of the movable element is arranged between the opposite planar surfaces and is polarised in a direction vertical thereto, and wherein the plurality of windings is arranged on respective stator yokes so that the windings are opposite one another on opposite stator elements, and so that at least the winding sides which are opposite the at least one magnet are arranged on the respective opposite surfaces in order to lie substantially in the same plane.

SUMMARY OF THE INVENTION

The object of the invention is to provide an electric linear motor and a testing device for an electronic device, for which motor and testing device a compact structural form and a simple manner of construction are ensured.

According to a first aspect of this invention, the object is achieved for an electric linear motor having a motor housing which is penetrated by an armature recess in which a first magnet arrangement is accommodated in a stationary manner and in which an armature which has a second magnet arrangement is accommodated to be linearly movable along a movement path, wherein one of the magnet arrangements comprises a coil arrangement with at least one coil and wherein the other magnet arrangement is configured as a permanent magnet arrangement, wherein at least one of the magnet arrangements comprises a magnetic flux guide configured as a profile body, the profile axis of which is oriented parallel to the movement path and which has at least one cross-sectional taper which is configured for a local increase of a flux resistance for a magnetic flux in the magnetic flux guide, oriented along a movement path of the armature in order to determine at least one preferred position for the armature along the movement path, wherein the cross-sectional taper has in the transverse direction to the movement path an extension which is less than an extension of the profile body in the transverse direction to the movement path.

The electric linear motor is configured to provide a linear movement along the movement path, the linear movement being based on a magnetic interaction between the two magnet arrangements. In order for the armature to move along the movement path, the coil arrangement must be supplied with a coil current, in order to be able to provide the desired magnetic interaction with the permanent magnet arrangement.

To be able to preset at least one preferred position for the armature along the movement path of the armature, without having to perform an open loop control or a closed loop control of the position of the armature for this purpose, the at least one cross-sectional taper is provided which is configured in the magnetic flux guide and which causes a local change in the flux density of the magnetic flux in the magnetic flux guide. Thus, the cross-sectional taper induces a local flux concentration for the magnetic flux in the magnetic flux guide which gives rise to a particularly strong local magnetic interaction of the two magnet arrangements.

Since, during the supply of electric current to the coil arrangement, the armature preferably adopts that position with respect to the first magnet arrangement accommodated in a stationary manner in the motor housing, in which position the magnetic interaction between the two magnet arrangements is greatest, it is thus possible to fix at least one preferred position for a movement of the armature along the movement path by the at least one cross-sectional taper. If there is a sufficient spacing between cross-sectional tapers arranged along the movement path, it is possible to preset a plurality of preferred positions for the armature along the movement path. In this respect, it is also advantageous if the coil arrangement comprises a plurality of coils which are arranged along the movement path and which can be electrically controlled separately.

Furthermore, a magnetic balance occurs for the armature in respect of the magnetic flux guide in the preferred position in the absence of a coil current in the coil arrangement, due to the flux concentration in the magnetic flux guide in the region of the cross-sectional taper. Thus, the armature can retain the preferred position in a self-holding manner without a supply of energy to the coil, provided that no external forces act on the armature, which exceed a constructively preset force level and/or provided that the coil is not charged with a coil current.

Accordingly, due to this at least one preferred position, the electric linear motor has, in spite of its simple construction, a characteristic which makes it interesting for particular uses as a substitute for a fluidic actuator, in particular for a pneumatic cylinder. In the case of a fluidic actuator, in particular a pneumatic cylinder, a preferred position can be maintained without a further energy supply by blocking accesses to the working chamber or chambers in the fluidic actuator, so that by inclosing the working fluid, a working piston does not move, provided that a presettable force level is not exceeded by external forces. This behaviour of fluidic actuators is advantageously replicated by the electric linear motor with the at least one cross-sectional taper in the magnetic flux guide.

The magnetic flux guide is configured as a profile body, thus it has a profile which is extruded along the profile axis, the profile axis being oriented parallel to the movement path. The at least one cross-sectional taper forms a local change in the profile, an extension of the cross-sectional taper in the transverse direction to the movement path being less than an extension of the profile body in the transverse direction to the movement path. This ensures that although the magnetic flux in the magnetic flux guide is concentrated locally, due to the cross-sectional taper and to a local reduction in a thickness of the magnetic flux guide, caused thereby, the full thickness of the magnetic flux guide is also available to the magnetic flux at least in particular areas in the region of the cross-sectional taper.

The subclaims relate to advantageous developments of the invention.

It is expedient if the magnetic flux guide is arranged with a largest surface opposite the magnet arrangement and if the extension of the cross-sectional taper in every surface direction of the largest surface is less than the extension of the largest surface in the respective surface direction. By way of example, the cross-sectional taper can be oriented parallel to a side edge in a magnetic flux guide which is configured as a plane parallel plate, the longest edge of which is oriented parallel to the movement path, which side edge, together with the longest edge, determines a largest surface of the magnetic flux guide, the extension of the cross-sectional taper in the direction of the side edge being shorter than the extension of the side edge. The cross-sectional taper is preferably configured in the manner of a groove or a slot, a longitudinal axis of the groove or a longitudinal axis of the slot extending transversely to the direction of movement and parallel to the largest surface of the magnetic flux guide. When considering the largest surface of the magnetic flux guide, size differences which can arise in curved surfaces, particularly in the case of a tubular magnetic flux guide, should be disregarded.

According to a further embodiment of the invention, it is provided that the cross-sectional taper is configured as a recess which completely penetrates the magnetic flux guide. This allows the cross-sectional taper to be advantageously produced by a separation process such as sawing, laser cutting, water jet cutting, punching or drilling, thereby making it possible to produce the magnetic flux guide in a cost-effective manner.

The cross-sectional taper is preferably, in particular exclusively, formed on a largest surface remote, in particular adverted, from the magnet arrangement. This is of interest particularly if the magnetic flux guide is configured with a curved profiling, because in this case machining a largest surface formed as an outer surface can be significantly easier than machining a largest surface of the magnetic flux guide formed as an inner surface. More preferably, it is provided that the magnetic flux guide is profiled in a circular-cylindrical manner and that the cross-sectional taper is introduced into the outer surface of the magnetic flux guide as a partially peripheral milled recess.

Additionally or alternatively, it is provided that the cross-sectional taper is formed, in particular exclusively, on a largest surface which faces the magnet arrangement. This is of interest particularly if the magnetic flux guide is configured in a double function as a housing or a housing component for the electric linear drive and if it is to have a smooth outer surface.

A further embodiment of the invention provides that the magnetic flux guide has a cylindrical, in particular a circular-cylindrical profiling, and that the cross-sectional taper has a limited extension in a peripheral direction of the magnetic flux guide. By way of example, the magnetic flux guide is configured as a tubular, circular-cylindrical sleeve and is provided with the cross-sectional taper on an outer surface or on an inner surface.

A further embodiment of the invention provides that the cross-sectional taper has a prismatic profiling and/or a profiling with a varying profile in the transverse direction, particularly in a peripheral direction. This type of profiling can be introduced into the magnetic flux guide by laser cutting or by water jet cutting, for example, and it allows an advantageous adaptation of the course of the magnetic flux through the magnetic flux guide.

An advantageous development of the invention provides that the armature has a cuboidal bounding geometry, and that at least one coil is arranged adjacently to one of the cuboid surfaces of the armature, the coil turns of which determine a winding axis oriented transversely to the cuboid surface, and that the other magnet arrangement is configured as a permanent magnet arrangement.

In particular, an electric linear motor with a motor housing is provided which is penetrated by an armature recess which accommodates a stationary, first magnet arrangement and a linearly movable rotor, with which a second magnet arrangement is associated, the armature having a cuboidal bounding geometry and one of the magnet arrangements comprising a coil arrangement with at least one coil which is arranged adjacently to one of the cuboid surfaces of the armature and the coil turns of which determine a winding axis oriented transversely to the cuboid surface, and the other magnet arrangement being configured as a permanent magnet arrangement.

Due to the geometric configuration of the armature with a cuboidal bounding geometry and due to the accommodation of the two magnet arrangements in the armature recess of the motor housing, it is possible to realise a particularly compact form of the electric linear motor. In this respect, it can be provided that associated with the armature is an actuating portion which projects out of the cuboidal bounding geometry. This actuating portion can be configured, for example, for a coupling to a machine component arranged outside the motor housing, or for a movement of a plug-in device which is provided for a temporary electrical connection to a device interface of a device to be tested. The motor housing is preferably also configured with a cuboidal bounding geometry, the bounding geometry of the motor housing and the bounding geometry of the armature being filled at least almost completely by the motor housing or respectively by the armature. This means that although the motor housing and the armature have slight differences in respect of the respective bounding geometry, a bounding volume, determined by the respective bounding geometry, is filled at least to 80 percent, preferably at least to 90 percent, in particular at least to 95 percent. The purpose of the two magnet arrangements is to cause a contactless introduction of force from the motor housing onto the armature by a magnetic interaction which can be brought about by the provision of coil current into the coil arrangement, so that the armature can be moved along a movement path and against external forces, possibly present, in the armature recess. The armature recess is preferably configured prismatically, in particular with a rectangular cross section, along the movement axis of the armature, and it preferably has one or more inner surfaces which are oriented parallel to the cuboid surfaces of the bounding geometry of the motor housing. The coil arrangement disposed in the armature recess is also adapted to a compact construction of the motor housing; for this purpose, the coil turns of the at least one coil are arranged laterally on the armature and they do not surround the armature. Instead, it is provided that a winding axis of the coil turns is oriented transversely to a cuboid surface of the bounding geometry of the armature. More preferably, it is provided that the winding axis of the coil turns is oriented transversely to a largest cuboid surface of the cuboidal bounding geometry of the armature. Since the coil turns do indeed preferably run in turn planes which are oriented adjacently to, in particular parallel to the cuboid surface of the armature, in practice they can have a three-dimensional course between two bounding planes, whereby it is possible for the bounding planes to include an angle of a few degrees to one another and to the cuboid surface of the armature, the winding axis is not necessarily oriented normally with an angle of 90 degrees, but is oriented with an orientation, possibly differing by a few degrees from a normal, with respect to the cuboid surface of the armature.

It is expedient if the permanent magnet arrangement comprises a plurality of plate-shaped permanent magnets, the narrow sides of which are arranged opposite, in particular adjoining one another and/or the largest surfaces of which are arranged adjacently to the turns of the coils. Due to the plate-shaped configuration of the permanent magnets which thus also have a cuboidal bounding geometry, it is possible to achieve an advantageous adaptation to the bounding geometries of the armature and to the motor housing, thereby ensuring an advantageous utilisation of the available installation space. The plate-shaped/cuboidal permanent magnets have mutually opposed largest surfaces which are interconnected by mutually opposed narrow sides and mutually opposed end faces. In this respect, it is preferably provided that a longest edge length of the narrow sides is chosen to be greater than a longest edge length of the end faces. It can also be provided that a shortest edge length of the narrow sides and of the end faces amounts to only a fraction of the longest edge length of the narrow sides and of the end faces, amounting in particular to less than 20 percent, preferably less than 10 percent, more preferably less than 5 percent of the longest edge length of the narrow sides and end faces. A particularly compact form of the permanent magnet arrangement can be realised by the adjoining positioning of the permanent magnets by their narrow sides. Furthermore, it can be additionally or alternatively provided that largest surfaces of the permanent magnets are arranged adjacently to the turns of the coil and thus they determine the cuboid surface, in particular the largest cuboid surface of the armature which is arranged adjacently to the coil arrangement.

An advantageous development of the invention provides that the permanent magnets are received by their end faces in a peripheral frame, and that arranged on the frame along at least one side thereof is a holding means having a U-shaped cross section which encompasses the frame and a respective end region of the end faces of the permanent magnets. It is preferably provided that the end faces and the narrow sides of the permanent magnets have a shortest common edge length which amounts to only a fraction of a longest edge length of the end faces and narrow sides. Therefore, a stable arrangement of the permanent magnets cannot be achieved due alone to the adjoining arrangement of the permanent magnets, while bearing in mind the magnetic forces emanating from the permanent magnets. Accordingly, the permanent magnets are accommodated in a peripheral frame which ensures that the permanent magnets are fixed with respect to one another. To additionally secure the permanent magnets in the peripheral frame, it is provided that a holding means having a U-shaped cross section is pushed onto the frame on at least one side thereof, which holding means encompasses a partial region of the frame and an end region of the end faces of the permanent magnets and thus ensures a form-locking fixing of the permanent magnets in the frame. In addition, it can be provided to adhesively bond the permanent magnets in the frame and with the U-shaped holding means.

It is preferably provided that the coil rests with a turn opposing the armature on a plate-shaped magnetic flux guide, in particular on an iron magnetic flux guide or on an insulation layer associated with the magnetic flux guide, the magnetic flux guide being associated with the motor housing. The purpose of the magnetic flux guide which can preferably be formed from a ferromagnetic material as an iron magnetic flux guide is to advantageously direct a magnetic flux which is provided during energisation of the coil, and to ensure a coupling of this magnetic flux onto the permanent magnet arrangement with a high magnetic efficiency. For an advantageous utilisation of the in particular cuboidal bounding geometry provided for the electric linear motor, the magnetic flux guide is also configured to be plate-shaped and likewise it has a cuboidal bounding geometry. Optionally arranged between the magnetic coil and the magnetic flux guide is an insulation layer, in particular an insulating foil which, if appropriate, is self-adhesive at least on one side and using which an electrical insulation between the magnetic coil and the magnetic flux guide can be improved.

A further embodiment of the invention provides that the cross-sectional taper is configured in the magnetic flux guide as an in particular groove-shaped recess or group of recesses, extending transversely to the movement path. To locally increase the flux resistance in the magnetic flux guide, the cross-sectional taper comprises one or more recesses which are introduced into the magnetic flux guide as imprints or depressions or which completely pass through the magnetic flux guide. To ensure the desired fixing of at least one preferred position for the armature, the cross-sectional taper extends transversely to the movement path of the armature. It is more preferably provided that the cross-sectional taper is introduced into the magnetic flux guide as a groove-shaped slot transversely to the movement path, it being possible to realise this slot as a depression or as a full notch in the magnetic flux guide. Alternatively, the cross-sectional taper can be configured as a row of holes which are arranged on the magnetic flux guide, for example along an axis, which for its part is oriented with respect to the movement path.

It is preferably provided that the coil arrangement forms the first magnet arrangement and comprises mutually opposite coils with winding axes which are oriented in parallel, in particular coaxially and between which the armature is received with the permanent magnet arrangement which forms the second magnet arrangement. The arrangement of coils on both sides of the armature allows an advantageous introduction of force onto the armature due to the magnetic interaction between the coil arrangement and the permanent magnet arrangement, as a result of which in particular reaction forces between the magnet arrangements can be minimised in spatial directions away from the movement path, so that bearing forces for mounting the armature with respect to the motor housing can also be kept as low as possible. This allows the use of a constructively simple mounting of the armature, for example a mounting by plain bearings.

This also applies in the same way to the arrangement of magnetic flux guides on both sides of the armature and to the orientation of the magnetisation for the permanent magnets of the permanent magnet arrangement. It is preferably provided that the armature is arranged symmetrically between the two magnetic flux guides, so that the magnetic forces between the permanent magnet arrangement of the armature and the magnetic flux guides which are produced in particular from a ferromagnetic material, cancel each other out and in this respect, the armature is accommodated in a force-free manner in the motor housing.

A further embodiment of the invention provides that the coil arrangement comprises one or more, in particular coreless rectangular coils/box coils, and/or that a control circuit is accommodated in the motor housing for the correct-movement current feed of the coil arrangement, which control circuit comprises a communication interface for communication with a superordinated control device. The coreless configuration of the coils means that it is possible to realise a simple construction method. The configuration of the coils as rectangular coils which are also called box coils enables the coil arrangement to be integrated in a space-saving manner into the armature recess of the cuboidal motor housing. It is preferably provided that the rectangular coils/box coils have a cuboidal bounding geometry with a preferably rectangular, in particular square base surface, and they have in the interior a cuboidal recess, preferably also with a square base surface. The coil arrangement can be advantageously controlled by means of the control circuit which is accommodated in the motor housing and is arranged in particular in the armature recess. The control circuit comprises a communication interface for communicating with a superordinated control device, for example a programmable logic controller (PLC) which provides the control circuit with a desired position signal which is converted by the control circuit into suitable coil currents for the respective coils.

For this purpose, it is advantageous if there is arranged in the armature recess at least one sensor arrangement for providing an actual position signal based on a position of the armature relative to the motor housing. The at least one actual position signal of the sensor arrangement can be supplied to the control circuit to allow an open loop position control or a closed loop position control for the armature, for example. The sensor arrangement is, for example, at least one magnetic field-sensitive sensor, in particular a Hall sensor, which is configured, for example, to detect the magnetic flux of the permanent magnet arrangement of the armature in order to allow a magnetic flux guide to a relative position of the armature with respect to the motor housing using the detected flux.

It is preferably provided that the armature recess is closed at the end face by an end plate which is preferably configured to conduct flux and which in particular is penetrated by a recess for a tongue extension formed on the armature. In this respect, the purpose of the at least one end plate is to close the armature recess at the end face thereof and to thereby prevent grime from passing into the armature recess, and also to serve as an end stop for a movement of the armature along the movement path. More preferably, it is provided that the at least one end plate is configured to conduct flux, so that it becomes part of a magnetic circuit and can thereby play a part in producing a preferred position. Furthermore, it can be provided that the end plate is penetrated by a recess, through which a tongue extension, formed on the armature can be guided out into the surroundings of the motor housing to allow linear movements to be introduced onto machine components on which the electric linear motor is fitted.

According to a second aspect, the object of the invention is achieved by a testing device for testing and/or programming an electronic device. This testing device comprises a device mount for temporarily fixing the device, a test control means for carrying out the testing, and also a plug-in device for temporarily electrically connecting the test control means to an interface of the device, the plug-in device being arranged on an armature of an electric linear motor according to the invention and the electric linear motor being electrically connected to the test control means and being arranged in a stationary manner on the device mount.

The purpose of the testing device is to allow an electronic device, such as a mobile telephone or a tablet computer to be tested and/or programmed. For this purpose, the testing device makes use of an electromechanical device interface which is provided on the device and is provided for electrical contacting by a plug-in device. In order to be able to ensure an automated testing procedure, the plug-in device is attached to the armature of an electric linear motor and is electrically connected to a test control means which stores one or more test programs provided for testing and, if appropriate, for programming the electronic device. Furthermore, it is provided that the test control means is connected to the electric linear motor to allow the electric linear motor to be controlled and to thereby allow the plug-in device to be plugged in or unplugged with respect to the device interface of the electronic device which is to be tested. Electronic devices of this type are typically tested and/or programmed in a testing arrangement which comprises a plurality of testing devices. Here, it is advantageous if a bounding geometry of the electric linear motor is the same as or is at least not greater than a bounding geometry of the electronic device to be tested, since in this case a compactly stacked arrangement of a plurality of testing devices can be provided. It is preferably provided that adjacent testing devices are arranged with mutually opposite largest surfaces of the electric linear motor.

BRIEF DESCRIPTION OF THE DRAWINGS

Advantageous embodiments of the invention are shown in the drawings, in which.

DETAILED DESCRIPTION OF THE PREFERRED EMBODIMENTS

Figure 1:
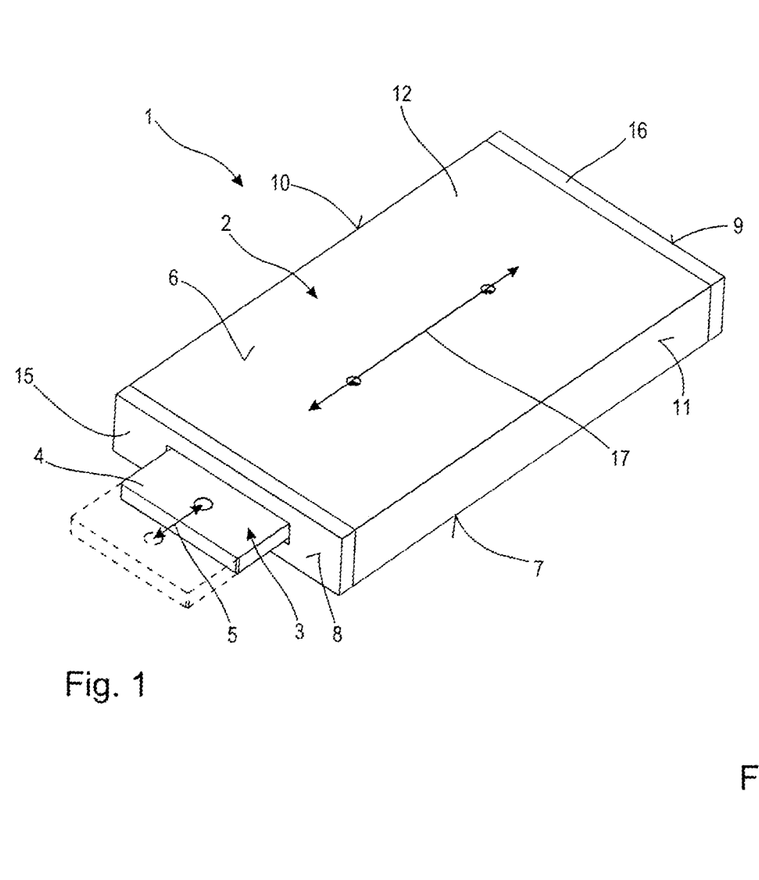
FIG. 1 is a perspective view of a first embodiment of an electric linear motor with two different preferred positions for the armature.
Figure 2:
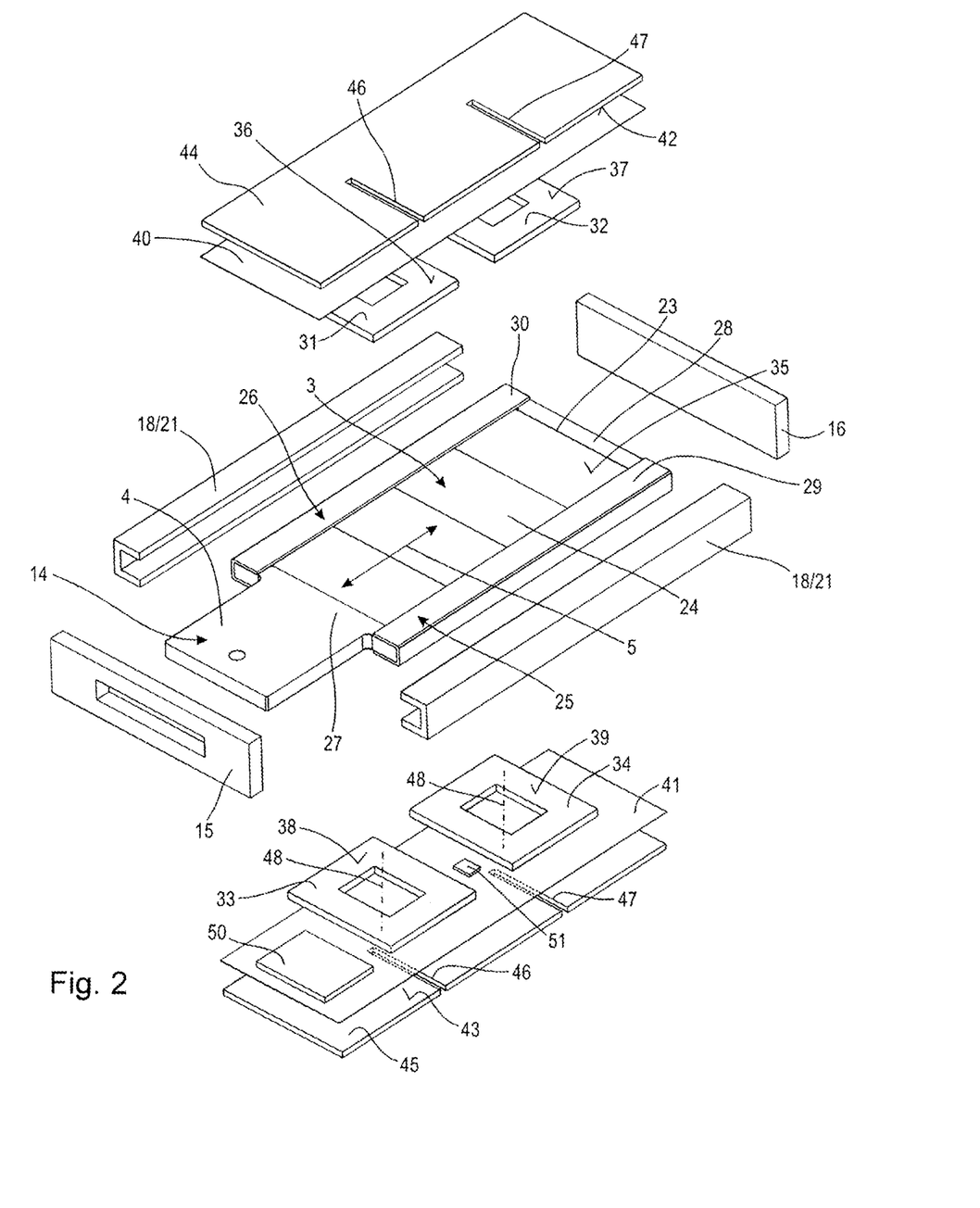
FIG. 2 is an exploded view of the components, accommodated in the motor housing (not shown), of the electric linear motor according to FIG. 1.
Figures 3, 4:
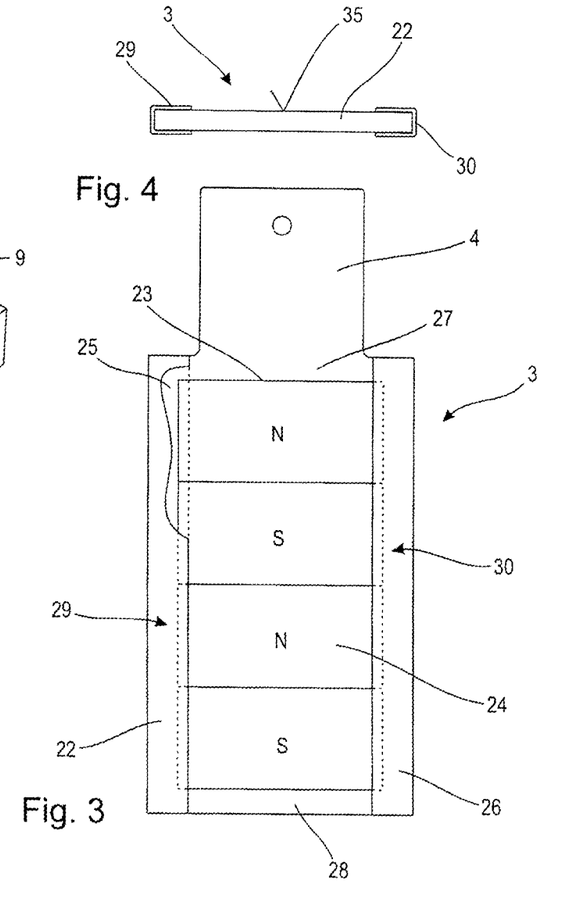
FIG. 3 is a front view of the armature.
FIG. 4 is a view from below of the armature according to FIG. 3.

An electric linear motor 1 according to a first embodiment, shown in a perspective view in FIG. 1, is configured to provide a linear movement to a machine component (not shown), and in this respect it comprises a motor housing 2 and an armature 3 which is shown in more detail in FIGS. 2 to 4, which is accommodated in a linearly movable manner in the motor housing 2 and penetrates the motor housing 2 with a tongue extension 4.

As illustrated by the dashed outline of the tongue extension 4 in FIG. 1, the armature 3 can perform a linear movement with the tongue extension 4 along a movement path 5. In this respect, the movement path 5 shown in FIG. 1 corresponds to a distance between two preferred positions which the armature 3 and the tongue extension 4, coupled thereto, can occupy and can maintain without a current supply within a presettable force interval. A movement path (not shown) for the armature 3 and the tongue extension 4 can be longer than the marked movement path 5 and is travelled by the armature 3 as a result of electrical energy being accordingly supplied to the electric linear motor 1.

By way of example, it is provided that the motor housing 2 of the electric linear motor 1 has a cuboidal bounding geometry which is formed as an arrangement of cuboid surfaces 6 and 7, 8 and 9 and 10 and 11 which are respectively arranged in pairs and are oriented vertically to one another. The cuboid surfaces 6 and 7 are also called the largest cuboid surfaces, the cuboid surfaces 8 and 9 are also called the end faces and the cuboid surfaces 10 and 11 are also called the narrow sides.

It is preferably provided that the motor housing 2 comprises a profile body 12 and two end plates 15, 16 which are mechanically interconnected in a manner which is not shown. Screw connections, for example, which are not shown in FIG. 1 can be provided for this purpose. Along the movement path 5 or along a longitudinal axis 17 oriented parallel to the movement path 5, the profile body 12 has a prismatic hollow profile with a rectangular outer cross section, which can be seen in FIG. 1, and a rectangular inner cross section (not shown), and it can be produced as an extruded aluminium profile, for example. Formed by the inner cross section, not shown in FIG. 1, of the profile body 12, is for example a cuboidal rotor recess 14 which likewise cannot be seen and into which the components of the electric linear motor 1, shown in FIG. 2, can be accommodated. The inner recess of the profile body 12 is delimited at the end faces by the end plates 15 and 16 which thereby also determine a maximum movement path for the armature 3 shown in more detail in FIGS. 2 to 4.

According to the view of FIG. 2, provided in the armature recess 14 in the motor housing 2 are, in addition to the armature 3, a guide arrangement 18, a coil arrangement 31, 32, 33, 34 and a magnetic flux guide arrangement 40, 45. The guide arrangement 18 forms together with the armature, described in more detail later on, a plain bearing for the linearly movable seating of the armature 3 in the motor housing 2. For this purpose, the guide arrangement 18 comprises two guide rails 21 which are respectively formed with a U-shaped profiling and the outer cross section of which is adapted to an inner cross section of the armature recess 14 (not shown) in the motor housing 2. These guide rails 21 can thus be inserted into the motor housing 2 at least virtually without any clearance and are accommodated therein in a stationary manner by the interaction with the end plates 15, 16 and the armature 3. The guide rails 21 are preferably produced from a plastics material which forms an advantageous tribological pairing with the armature 3.

The armature 3 shown in FIGS. 2 to 4 comprises a frame 22 with a rectangular base surface, into which a recess 23 which is also rectangular is introduced, into which a magnet arrangement consisting of four plate-shaped permanent magnets 24, for example, is introduced. In this respect, the recess 23 in the frame 22 and the permanent magnets 24 are coordinated with one another such that the permanent magnets 24 are accommodated in a form-locking manner in the frame 22 in the direction of the movement path 5 and in a direction transverse thereto. To ensure that the permanent magnets 24 are also fixed in the third spatial direction, pushed onto the longer frame sides 25, 26 of the frame 22 are in each case magnet holders 29, 30 of a U-shaped cross section which encompass the longer frame sides 25, 26 as well as end-face end regions of the permanent magnets 24 in a form-locking manner. In addition, it can be provided to fix the permanent magnets 24 in the frame 22 by a flowing material, in particular by adhesive bonding. It is provided by way of example to produce the magnet holders 29, 30 from a non-magnetisable resilient metal material, so that the magnet holders 29, 30 do not influence a magnetic flux of the permanent magnets 24.

The permanent magnets 24 are respectively magnetised in opposite directions, as is symbolised in FIG. 3 by the marking of the north poles N and the south poles S. Adjoining a shorter side 27 of the frame 22 is the tongue extension 4; the other shorter side 28 of the frame serves as a stop for the end plate 16 to terminate the movement path of the armature 3.

Purely by way of example, the coil arrangement is formed by the four box coils 31, 32, 33, 34 which respectively have a cuboidal bounding geometry and a cuboidal recess and are arranged in opposing pairs with respect to the armature 3. Furthermore, it is provided purely by way of example that winding axes 48 in each case of opposite box coils 31, 33 and 32, 34 are arranged coaxially to one another. The preferably coreless box coils 31 to 34 can be produced, for example, from self-bonding wire and can be configured to be inherently stable. The turns (not shown) of the box coils 31 to 34 are preferably arranged in turn planes (not shown) which, for their part, are oriented substantially parallel to a largest surface 35 of the armature 3.

It is provided by way of example to attach the box coils 31 to 34 with largest surfaces 36 to 39, remote from the armature 3, on largest surfaces 42, 43 of magnetic flux guides 44, 45 with the interconnection of an insulating foil 40, 41. It can be provided by way of example to fix the box coils 31 to 34 to the insulating foils 40 and 41 using an adhesive layer, which foils are in turn fixed to the magnetic flux guides 44 and 45 by a further adhesive layer, for example.

Each of the magnetic flux guides 44, 45 is produced from a ferromagnetic material, in particular iron, and has a cuboidal bounding geometry, the expanse of which is determined by the outer edges of the respective magnetic flux guides 44, 45. Introduced into each of the magnetic flux guides 44, 45 are, for example, two recesses 46, 47 which are provided in the manner of notches and which are formed as cross-sectional tapers for a local increase of a flux resistance for the magnetic flux in the magnetic flux guide 44, 45 oriented along the movement path 5, to fix preferred positions for the armature 3 along the movement path 5. Preferred power-free positions for the armature 3 are thus determined along the movement path 5 by these recesses 46, 47. In an embodiment of the magnetic flux guides 44, 45 which is not shown, the recesses 46, 47 extending transversely to the movement path 5 can also be configured as milled slots or as an arrangement of holes or openings in the respective magnetic flux guides 44, 45.

It can be provided by way of example to perform the electrical connection of the box coils 31, 32, 33, 34 through the recesses 46, 47, thereby making it possible to realise a compact arrangement of the box coils 31 to 34 on the magnetic flux guides 44, 45. In this case, it can be provided to preform the insulating foil 40, 41 such that the preformed region engages into the recesses 46 and 47 and lines them to a certain extent, so that the electrical connection lines for the box coils 31 to 34 can be reliably guided in an insulated channel guided through the recesses.

Purely by way of example, arranged next to the box coil 33 is a control circuit 50 which is configured to provide coil currents to the box coils 31 to 34 and which comprises a microprocessor (not shown) and driver modules for the individual box coils 31 to 34. The microprocessor is configured to control the drive modules, which can be in particular end stages of power amplifiers, on the basis of an external control signal which can be provided by a communication interface (not shown) to an outer surface of the motor housing 2 from a superordinated control device (also not shown). Additionally or alternatively, the microprocessor is configured to control the driver modules based on a sensor signal from a sensor arrangement 51, in which case purely by way of example the sensor arrangement is arranged between the box coils 33 and 34 and is configured, for example, as a Hall sensor for detecting the magnetic flux of the permanent magnets 24.

Figure 5:
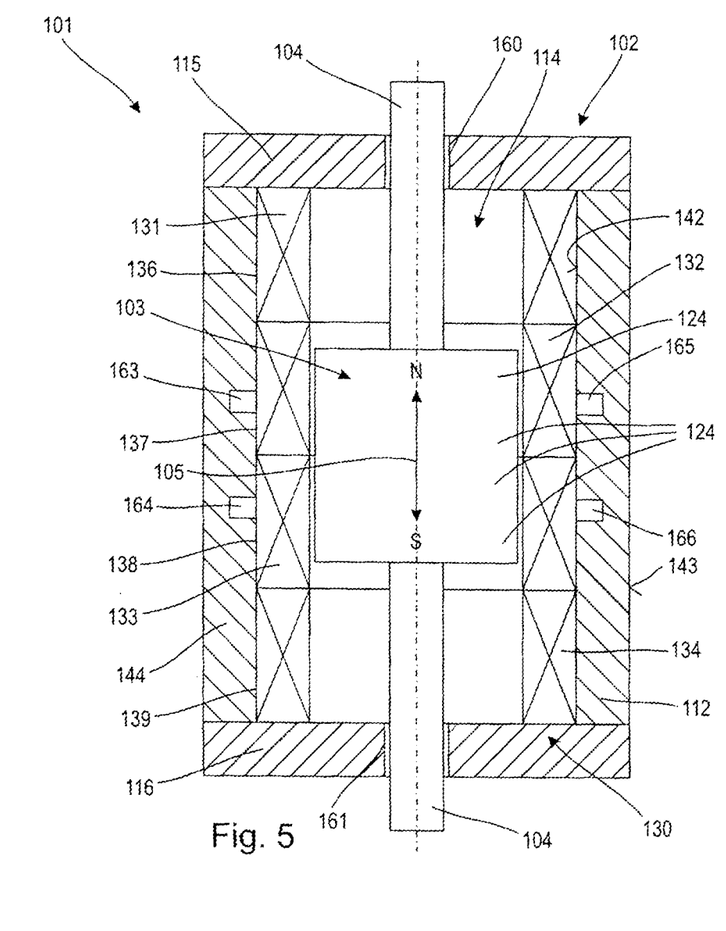
FIG. 5 is a schematic longitudinal sectional view of a second embodiment of an electric linear motor.

An electric linear motor 101, shown schematically in FIG. 5, is configured to provide a linear movement to a machine component (not shown), and in this respect, comprises a motor housing 102 and an armature 103 which is accommodated in a linearly movable manner in the motor housing 102 and is provided with guide rods 104 arranged on its end faces. The armature 103 is configured for a linear movement along a movement path 105. The position of the armature 103 along the movement path 105 corresponds to a preferred position which the armature 103 can occupy and can maintain without a supply of current within a presettable force interval. The armature 103 can be moved out of the shown preferred position as a result of electrical energy being supplied to the electric linear motor 101.

By way of example, it is provided that the motor housing 102 of the electric linear motor 101 has a circular cylindrical bounding geometry which is formed by a sleeve-shaped profile body 112 and by two annular end plates 115, 116 which are mechanically interconnected in a manner which is not shown.

The profile body 112 delimits together with the end plates 115, 116 a circular cylindrical rotor recess 114, in which the armature 103 is accommodated in a linearly movable manner.

Purely by way of example, provided in the armature recess 114 is a coil arrangement 130 with a plurality of, for example circular toroidal coils 131, 132, 133, 134 which can be connected to a control device in a manner which is not shown, the control device being configured to provide individual toroidal coils 131, 132, 133, 134 with electrical energy. A linear sliding guidance of the armature 103 is ensured by recesses 160, 161 in the end plates 115, 116.

The armature 103 is shown purely schematically and comprises, for example, a magnet arrangement with a hollow cylindrical permanent magnet 124 which is magnetised in the direction of the movement path 105, as is symbolised in FIG. 5 by the marking of the North Pole N and of the South Pole S.

The preferably coreless toroidal coils 131 to 134 can be produced, for example, from self-bonding wire and they can be configured to be inherently stable. It is provided by way of example to attach the toroidal coils 131 to 134 with largest surfaces 136 to 139, remote from the armature 103, to an inner surface 142 of a sleeve-shaped magnetic flux guide 144 which is profiled in the form of a circular ring, for example.

Figure 6:
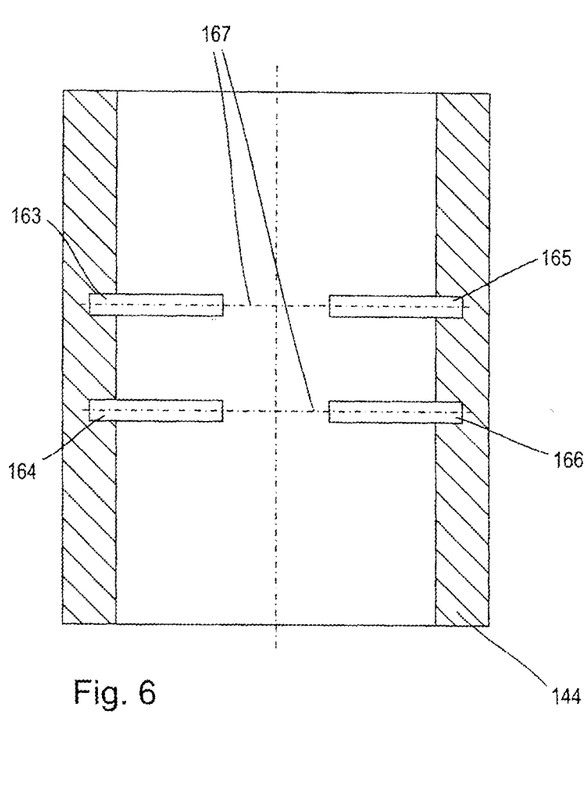
FIG. 6 is a schematic longitudinal sectional view of the magnetic flux guide of the electric linear motor according to FIG. 5.

The magnetic flux guide 144 which is tubular, for example, and is shown in detail in FIG. 6 is produced from a ferromagnetic material, in particular iron and, purely by way of example, has on its inner surface 142 for example four groove-shaped recesses 163, 164, 165, 166 which are configured as cross-sectional tapers for a local increase of a flux resistance for the magnetic flux in the magnetic flux guide 144 oriented along the movement path 105, in order to fix preferred positions for the armature 103 along the movement path 105. A preferred power-free position for the armature 103 is thus determined along the movement path 105 by these recesses 163, 164, 165, 166.

In an embodiment of the magnetic flux guides which is not shown, the recesses 163, 164, 165, 166 which extend, according to FIG. 6, with their main extent or groove axis 167 transversely to the movement path 105 can also be configured as milled slots on an outer surface 143 of the magnetic flux guide or as an arrangement of holes or openings in the magnetic flux guide 144.

The invention claimed is:

1. An electric linear motor having a motor housing, which is penetrated by an armature recess, in which a first magnet arrangement is accommodated in a stationary manner and in which an armature, which has a second magnet arrangement, is accommodated to be linearly movable along a movement path, wherein one of the magnet arrangements comprises a coil arrangement with at least one coil and wherein the other magnet arrangement is configured as a permanent magnet arrangement, wherein at least one of the magnet arrangements comprises a magnetic flux guide configured as a profile body, a profile axis of which is oriented parallel to the movement path and which has at least one cross-sectional taper which is configured for a local increase of a flux resistance for a magnetic flux in the magnetic flux guide, oriented along the movement path of the armature in order to determine at least one preferred position for the armature along the movement path, wherein the cross-sectional taper has in the transverse direction to the movement path an extension which is less than an extension of the profile body in the transverse direction to the movement path.

2. The electric linear motor according to claim 1, wherein the magnetic flux guide is arranged with a largest surface opposite the magnet arrangement, and wherein the extension of the cross-sectional taper in every surface direction of the largest surface is less than the extension of the largest surface in the respective surface direction.

3. The electric linear motor according to claim 1, wherein the cross-sectional taper is configured as a recess which completely penetrates the magnetic flux guide.

4. The electric linear motor according to claim 1, wherein the cross-sectional taper is formed on a largest surface remote from the magnet arrangement.

5. The electric linear motor according to claim 1, wherein the cross-sectional taper is formed on a largest surface facing the magnet arrangement.

6. The electric linear motor according to claim 1, wherein the magnetic flux guide has a cylindrical profiling and wherein the cross-sectional taper has an extension in a peripheral direction of the magnetic flux guide.

7. The electric linear motor according to claim 1, wherein the cross-sectional taper has a prismatic profiling and/or a profiling with a varying profile in a peripheral direction.

8. The electric linear motor according to claim 1, wherein the armature has a cuboidal bounding geometry, and wherein at least one coil is arranged adjacently to one of the cuboid surfaces of the armature, the coil turns of which determine a winding axis oriented transversely to the cuboid surface, and wherein the other magnet arrangement is configured as a permanent magnet arrangement.

9. The electric linear motor according to claim 8, wherein the permanent magnet arrangement comprises a plurality of plate-shaped permanent magnets, the narrow sides of which are arranged opposite one another and/or the largest surfaces of which are arranged adjacently to turn planes of the coils.

10. The electric linear motor according to claim 9, wherein the permanent magnets are accommodated with their end faces in a peripheral frame, and arranged on the frame along at least one side thereof is a holding means having a U-shaped cross section which encompasses the frame and a respective end region of the end faces of the permanent magnets.

11. The electric linear motor according to claim 8, wherein the coil rests with a turn opposing the armature on a plate-shaped magnetic flux guide or on an insulation layer associated with the magnetic flux guide, the magnetic flux guide being associated with the motor housing.

12. The electric linear motor according to claim 1, wherein the cross-sectional taper is configured as a groove-shaped, recess or group of recesses in the magnetic flux guide extending transversely to the movement path.

13. The electric linear motor according to claim 8, wherein the coil arrangement forms the first magnet arrangement and comprises mutually opposite coils with winding axes which are oriented in parallel, and between which the armature is received with the permanent magnet arrangement which forms the second magnet arrangement.

14. The electric linear motor according to claim 13, wherein a respective magnetic flux guide is arranged on both sides of the armature, and wherein the permanent magnets of the permanent magnet arrangement respectively have a magnetisation which is oriented in the direction of the magnetic flux guides.

15. The electric linear motor according to claim 8, wherein the coil arrangement comprises one or more rectangular coils or box coils, and/or a control circuit is accommodated in the motor housing for the correct-movement current feed of the coil arrangement, which control circuit comprises a communication interface for communication with a superordinated control device.

16. The electric linear motor according to claim 8, wherein, arranged in the armature recess, is at least one sensor arrangement for providing an actual position signal based on a position of the armature relative to the motor housing.

17. The electric linear motor according to claim 8, wherein the armature recess is closed at an end face by an end plate.

18. A testing device for testing and/or programming an electronic device, having a device mount for temporarily fixing the device, a test control means for carrying out the testing, and also having a plug-in device for temporarily electrically connecting the test control means to an interface of the device, wherein the plug-in device is arranged on an armature of an electric linear motor according to claim 1, and wherein the electric linear motor is electrically connected to the test control means and is arranged in a stationary manner on the device mount.

19. The electric linear motor according to claim 17, wherein the end plate is configured to conduct flux and/or the end plate is penetrated by a recess for a tongue extension formed on the armature.

* * * * *